US011587923B2

(12) United States Patent
Lin

(10) Patent No.: US 11,587,923 B2
(45) Date of Patent: Feb. 21, 2023

(54) MULTICHIP PACKAGE MANUFACTURING PROCESS

(71) Applicant: eGalax_eMPIA Technology Inc., Taipei (TW)

(72) Inventor: Po-Chuan Lin, Taipei (TW)

(73) Assignee: EGALAX_EMPIA TECHNOLOGY INC., Taipei (TW)

( * ) Notice: Subject to any disclaimer, the term of this patent is extended or adjusted under 35 U.S.C. 154(b) by 166 days.

(21) Appl. No.: 17/034,221

(22) Filed: Sep. 28, 2020

(65) Prior Publication Data
US 2022/0028851 A1    Jan. 27, 2022

(30) Foreign Application Priority Data

Jul. 24, 2020   (TW) ................... 109125166

(51) Int. Cl.
*H01L 25/00*    (2006.01)
*H01L 25/07*    (2006.01)
(Continued)

(52) U.S. Cl.
CPC .......... *H01L 25/50* (2013.01); *H01L 21/4853* (2013.01); *H01L 21/78* (2013.01);
(Continued)

(58) Field of Classification Search
CPC ..... H01L 25/50; H01L 21/4853; H01L 21/78; H01L 22/12; H01L 23/49541; H01L 23/49575; H01L 23/49844; H01L 24/06; H01L 24/48; H01L 25/074; H01L 24/05; H01L 24/32; H01L 24/49; H01L 24/73; H01L 24/83; H01L 24/85; H01L 24/92; H01L 2224/02373; H01L 2224/04042; H01L 2224/05554; H01L 2224/0612; H01L 2224/32145; H01L 2224/48091;
(Continued)

(56) References Cited

U.S. PATENT DOCUMENTS

| 8,390,103 | B2 * | 3/2013 | Zhao | ................. H01L 23/49575 |
| | | | | 257/692 |
| 2009/0108425 | A1 * | 4/2009 | Lee | ..................... H01L 25/0652 |
| | | | | 257/679 |

(Continued)

*Primary Examiner* — Bilkis Jahan
*Assistant Examiner* — Victor V Barzykin
(74) *Attorney, Agent, or Firm* — Muncy, Geissler, Olds & Lowe, P.C.

(57) ABSTRACT

Multichip package manufacturing process is disclosed to form external pins at one side or each side of die-bonding area of package carrier board and to bond first IC and second IC to die-bonding area in stack. First IC and second IC each comprise transistor layer with core circuits, plurality of metal layers, plurality of VIA layers and solder pad layer. During production of first IC, design of at least one metal layer, VIA layer and dummy pads can be modified according to change of design of second IC. After chip probing, die sawing and bonding, wire bonding, packaging and final test are performed to package the package carrier board, first IC and second IC into automotive multichip package, achieving purpose of first IC only need to modify at least one layer or more than one layer to cooperate with second IC design change to carry out multichip packaging process.

7 Claims, 7 Drawing Sheets

(51) Int. Cl.
  *H01L 23/00*   (2006.01)
  *H01L 23/498*  (2006.01)
  *H01L 21/78*   (2006.01)
  *H01L 21/66*   (2006.01)
  *H01L 21/48*   (2006.01)
  *H01L 23/495*  (2006.01)
(52) U.S. Cl.
  CPC ........ *H01L 22/12* (2013.01); *H01L 23/49541* (2013.01); *H01L 23/49575* (2013.01); *H01L 23/49844* (2013.01); *H01L 24/06* (2013.01); *H01L 24/48* (2013.01); *H01L 25/074* (2013.01); *H01L 24/05* (2013.01); *H01L 24/32* (2013.01); *H01L 24/49* (2013.01); *H01L 24/73* (2013.01); *H01L 24/83* (2013.01); *H01L 24/85* (2013.01); *H01L 24/92* (2013.01); *H01L 2224/02373* (2013.01); *H01L 2224/04042* (2013.01); *H01L 2224/05554* (2013.01); *H01L 2224/0612* (2013.01); *H01L 2224/32145* (2013.01); *H01L 2224/4823* (2013.01); *H01L 2224/48091* (2013.01); *H01L 2224/48145* (2013.01); *H01L 2224/49113* (2013.01); *H01L 2224/49171* (2013.01); *H01L 2224/49175* (2013.01); *H01L 2224/49431* (2013.01); *H01L 2224/73265* (2013.01); *H01L 2224/92247* (2013.01); *H01L 2924/00014* (2013.01); *H01L 2924/1304* (2013.01); *H01L 2924/14* (2013.01)

(58) Field of Classification Search
  CPC ... H01L 2224/48145; H01L 2224/4823; H01L 2224/49113; H01L 2224/49171; H01L 2224/49175; H01L 2224/49431; H01L 2224/73265; H01L 2224/92247; H01L 2924/00014; H01L 2924/1304; H01L 2924/14
  See application file for complete search history.

(56) References Cited

U.S. PATENT DOCUMENTS

| | | | |
|---|---|---|---|
| 2011/0068449 A1* | 3/2011 | Kook | H01L 25/50 257/784 |
| 2014/0175660 A1* | 6/2014 | Lee | H01L 25/0657 257/773 |
| 2015/0200187 A1* | 7/2015 | Park | H01L 25/0657 257/777 |
| 2018/0145053 A1* | 5/2018 | Jung | H01L 24/06 |
| 2018/0204828 A1* | 7/2018 | Lu | H01L 21/486 |
| 2019/0259742 A1* | 8/2019 | Han | H01L 24/16 |
| 2020/0258841 A1* | 8/2020 | Kim | H01L 23/3128 |

* cited by examiner

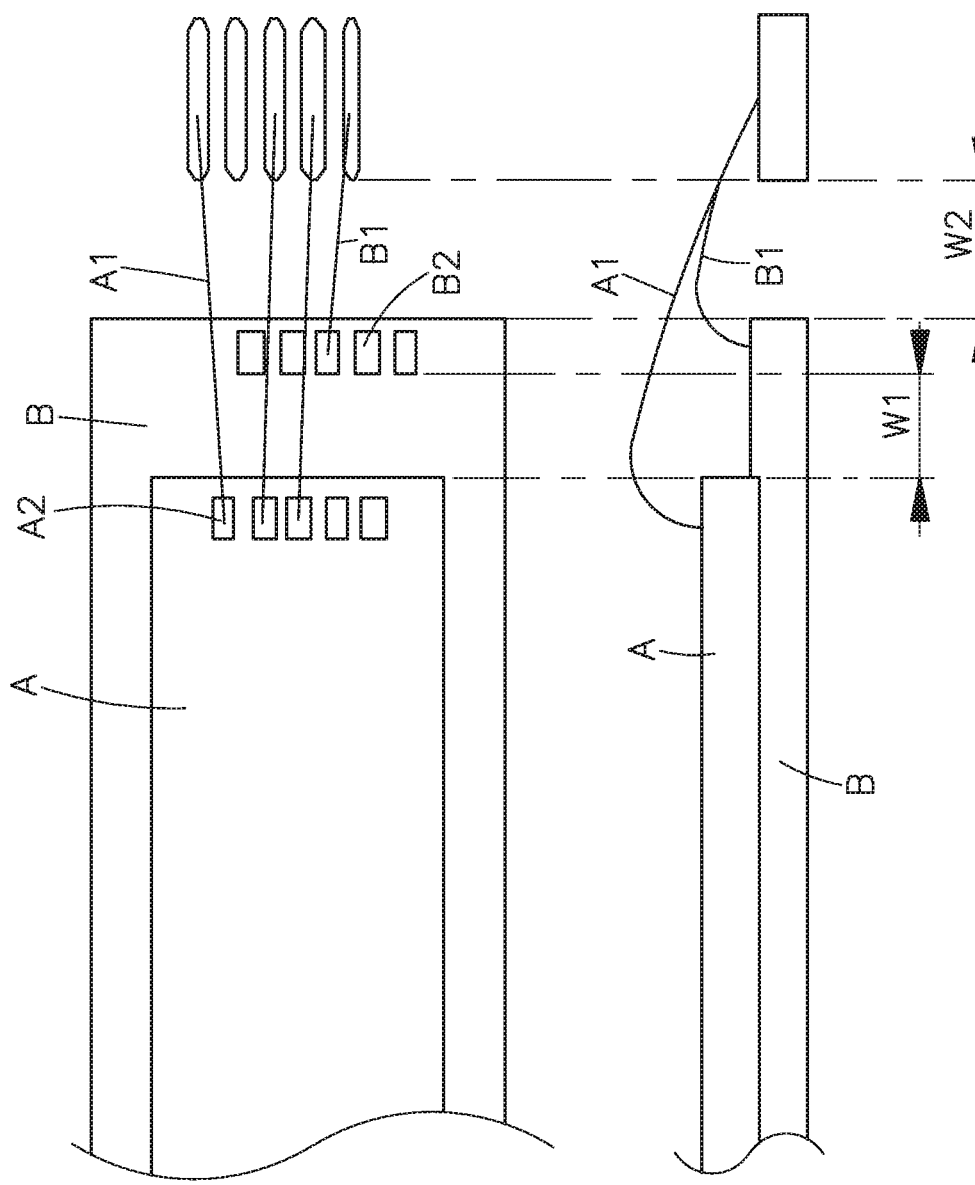

MULTICHIP PACKAGE MANUFACTURING PROCESS

This application claims the priority benefit of Taiwan patent application number 109125166, filed on Jul. 24, 2020.

BACKGROUND OF THE INVENTION

1. Field of the Invention

The present invention relates to multichip package manufacturing technology and more particularly, to a multichip package manufacturing process for making a multichip package for car PC. Through the second IC on the first IC on the package carrier board, the first IC can be modified according to the different design of the second IC for at least one layer or more than one layer, and then the automotive multichip design and packaging can be carried out to achieve the purpose of saving design costs and facilitating processing and production.

2. Description of the Related Art

In general, automotive ICs used in car computers are mostly automotive ICs in a quadrangular lead-free (QFN) package, and this type of automotive ICs is designed to stack two ICs (please also refer to FIGS. 5, 6, and 7).

The production of the upper IC A located on the top is implemented according to the following steps: (E01) basic function design of upper IC A; (E02) transistor layer production; (E03) first metal layer production; (E04) first VIA layer production; (E05) second metal layer production; (E06) second VIA layer production; (E07) third metal layer production; (E08) third VIA layer production; (E09) fourth metal layer production; (E10) solder pad layer production; (E11) chip probing.

The production of the lower IC B located on the bottom is implemented according to the following steps: (F01) basic function design of lower IC B; (F02) transistor layer production; (F03) first metal layer production; (F04) first VIA layer production; (F05) second metal layer production; (F06) second VIA layer production; (F07) third metal layer production; (F08) third VIA layer production; (F09) fourth metal layer production; (F10) solder pad layer production; (F11) redistribution layer design; (F12) first polymer layer production; (F13) redistribution layer production; (F14) second polymer layer production; (F15) under bump metallurgy production; (F16) chip probing; (E12) fixation of the upper IC A on the lower IC B made in the above steps (E01)~(E11); (E13) die sawing and bonding; (E14) wire bonding; (E15) packaging; (E16) final test; (E17) formation of automotive multichip package.

However, the upper IC A and the lower IC B are produced by different manufacturers. Because the ICs A, B and their lines, solder pads and other design configurations are different, the adjacent distances W1 and W2 are also different. The solder pads B2 of the lower IC B must match the layout, configuration and adjustment of the solder pad pins of the solder pads A2 of the upper IC A. However, if you want to replace the upper IC A manufactured by a different manufacturer, the layout, configuration, and soldering pads of the lower IC B must be redesigned and adjusted. After the packaging is completed, the automotive multichip package must be tested again, which is quite time-consuming and labor-intensive, extremely uneconomical. It needs to study how to solve the problem that the current automotive IC bonding wires are easy to overlap or contact during packaging that can cause short circuits, failures and troubles, and the problem that when you want to replace the stacked ICs used, you must redesign the circuit layout and welding leads.

Furthermore, when the upper IC A and the lower IC B are stacked, the bonding wired A1 of the upper IC A must pay attention to the angle. The bonding wires A1 of different signals cannot be staggered, and the bonding wires A1, B1 of the upper IC A and the lower IC B must form a height difference and cannot produce overlapping contacts, otherwise there will be a short circuit. However, due to packaging pressure, colloidal mold flow and other factors during the packaging process, it is quite easy to cause the adjacent bonding wires A1 and B to sink, bend or shift, etc., and form bonding wires A1 and B1 overlap and contact short-circuit. (As shown by the circle mark in the upper left and lower right corners of FIGS. 5 and 6), resulting in failure of automotive IC packaging and rise in product failure rate. In order to maintain the height difference between bonding wires A1 and B1 of the two ICs A and B, the automotive multichip package has a higher thickness, that is, it is not easy to meet the design concept of light, thin, short and small electronic products. During the design and production of the prior art upper IC A and lower IC B, it is necessary to redesign each metal layer, each VIA layer and the solder pad layer according to different lines and different solder pad pin positions. When replacing the upper IC A made by a different manufacturer, the original lower IC B will form an unusable inventory, resulting in increased production costs. Redesigning the circuit layout of lower IC B and re-making a different lower IC B to match the upper IC A provided by a different manufacturer have to pay the cost of redesigning the lower IC B, which is not economical. It is the direction that relevant manufacturers in this industry want to study and improve.

SUMMARY OF THE INVENTION

In view of the above-mentioned problems and deficiencies, the inventor collected relevant information, evaluated and considered from many parties, and with years of experience in this industry, through continuous research and development and modification, he designed this automotive multichip package manufacturing process of quad flat no-lead (QFN) packaging type.

The first objective of the present invention is that the quad flat no-lead packaged multichip is provided with external pins on at least one side of the die bonding area of the package carrier, and the first IC with core circuits and second IC with core circuits are fixed at the die bonding area. The first IC and the second IC respectively comprise a transistor layer, a plurality of metal layers, a plurality of VIA layers and a solder pad layer. During the manufacturing process of the first IC, according to different design changes of the second IC, at least one metal layer, at least one VIA layer and the multiple dummy pads of the first pad layer can be modified. After chip probing, the first IC and the second IC are subjected to die cutting and die bonding, wire bonding, packaging and final test to form an automotive multichip package, achieving the purpose of first IC only need to modify at least one layer or more than one layer to cooperate with the second IC design change to carry out the multichip packaging process.

The secondary objective of the present invention is that the core circuits of the first IC include a transistor layer, a plurality of metal layers and a plurality of VIA layers. Each metal layer is provided with a plurality of lines in the X-axis or Y-axis. Each VIA layer is located between two adjacent metal layers and is provided with vias for connecting the lines of the upper and lower two adjacent metal layers. The first solder pad layer of the first IC comprises a plurality of input and output units and a plurality of first solder pads located at at least one side of the core circuits and electrically connected through the lines, and a plurality of dummy pads located between at least one side of the core circuits and the input and output units. The core circuits of the first IC can be respectively electrically connected to the transistor layer, each input and output unit, each first solder pad and each dummy pad of the first solder pad layer by the lines of each metal layer. After fixation of the second IC on the transistor layer of the core circuits of the first IC, the subsequent steps of die sawing and bonding, wire bonding, packaging and final test are performed.

The third objective of the present invention is that the core circuits of the first IC include a transistor layer, a plurality of metal layers and a plurality of VIA layers. Each metal layer is provided with a plurality of lines in the X-axis or Y-axis. Each VIA layer is located between upper and lower two adjacent metal layers and is provided with vias for connecting the lines of the upper and lower two adjacent metal layers. The first solder pad layer of the first IC comprises a plurality of input and output units and a plurality of first solder pads located at at least one side of the core circuits and electrically connected through the lines, and a plurality of dummy pads located between the input and output units and the first solder pads. The core circuits of the first IC can be respectively electrically connected to the transistor layer, each input and output unit, each first solder pad and each dummy pad of the first solder pad layer by the lines of each metal layer. After fixation of the second IC on the transistor layer of the core circuits of the first IC, the subsequent steps of die sawing and bonding, wire bonding, packaging and final test are performed.

The fourth objective of the present invention is that when the design needs to replace the second IC of a different manufacturer, you only need to modify the fourth metal layer, the fourth VIA layer, the fifth metal layer and the plural first solder pads and plural dummy pads of the first solder pad layer of the on the top of the first IC without needing to modify other layers under the fourth metal layer. It can reduce the cost of re-designing the circuit layout, save process time and labor, and can be more in line with economic benefits.

Other advantages and features of the present invention will be fully understood by reference to the following specification in conjunction with the accompanying drawings, in which like reference signs denote like components of structure.

BRIEF DESCRIPTION OF THE DRAWINGS

FIG. 7 is a side view of an automotive IC made according to the prior art.

DETAILED DESCRIPTION OF THE PREFERRED EMBODIMENT

Figure 1:
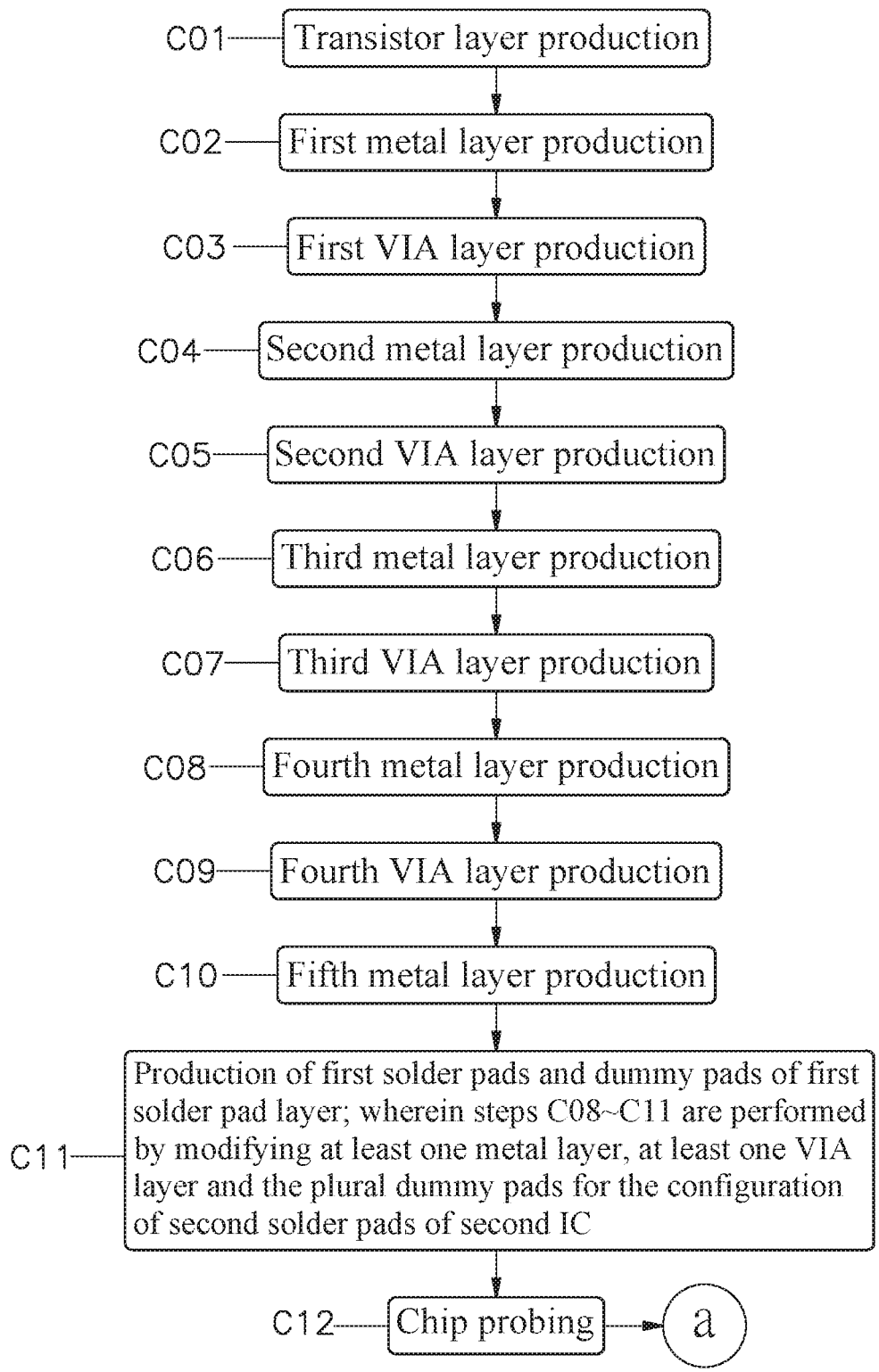
FIG. 1 is a multichip production flow chart in accordance with the present invention (I).
Figure 2:
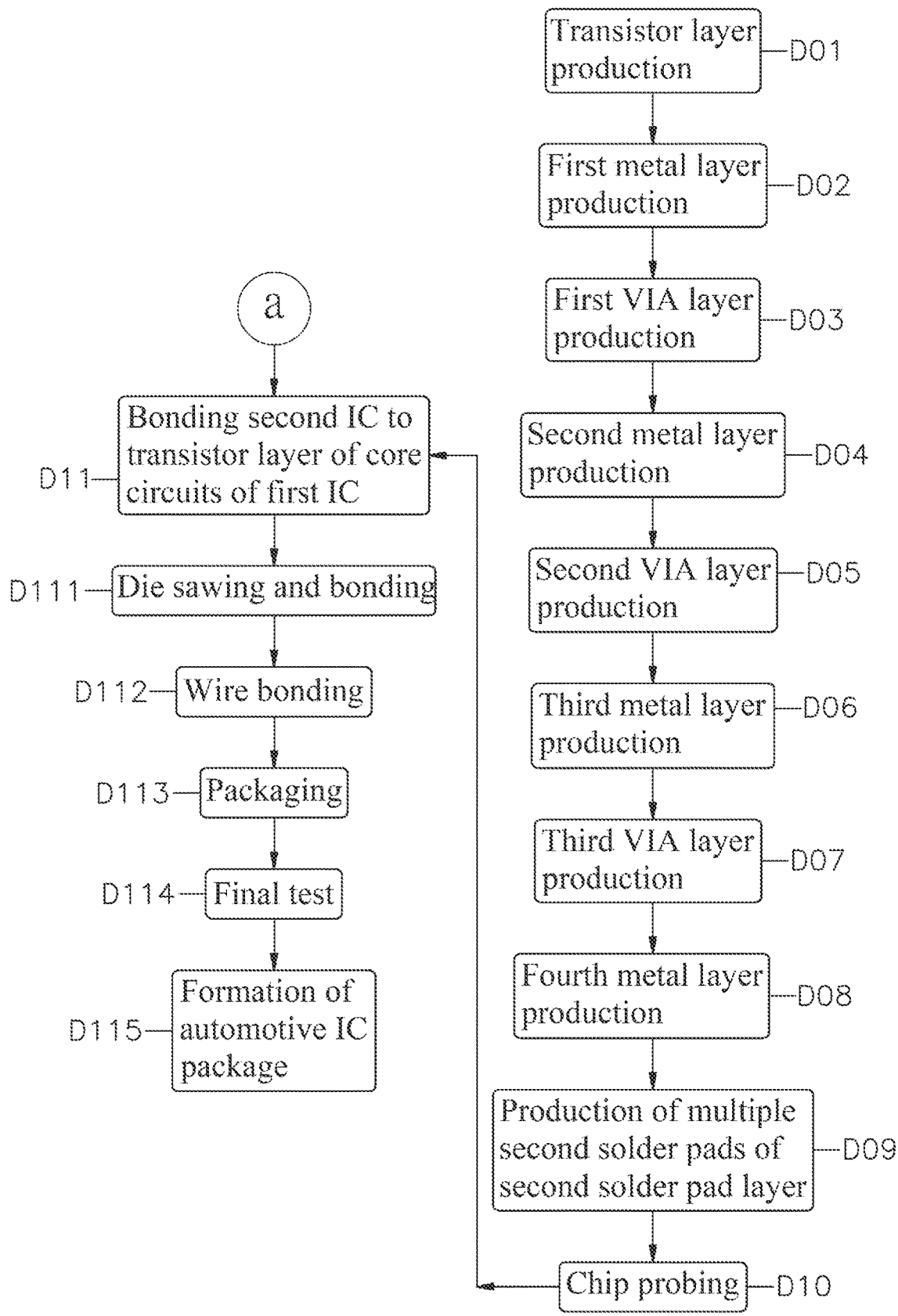
FIG. 2 is a multichip production flow chart in accordance with the present invention (II).
Figure 3:
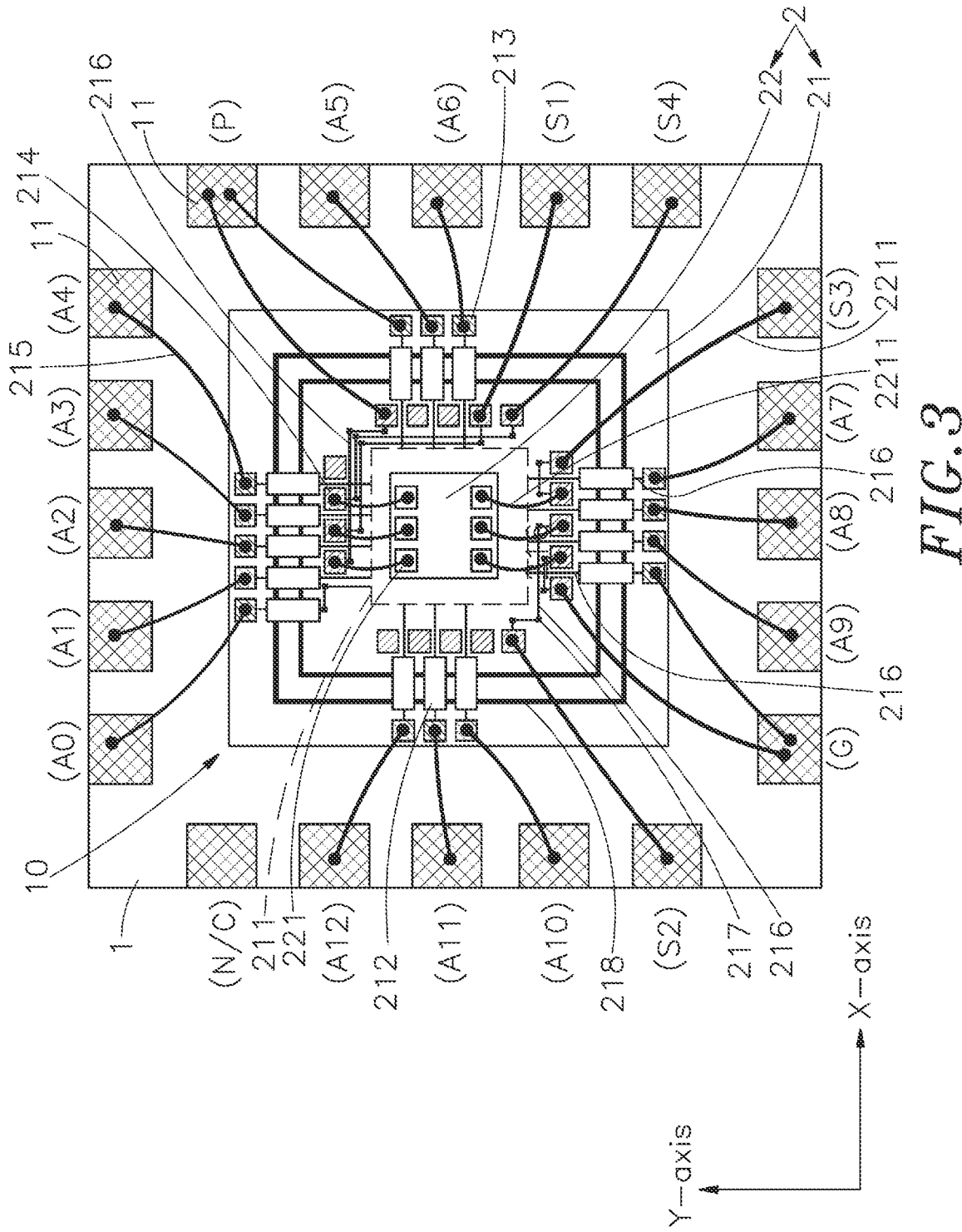
FIG. 3 is a top view of a multichip made in accordance with the present invention.
Figure 4:
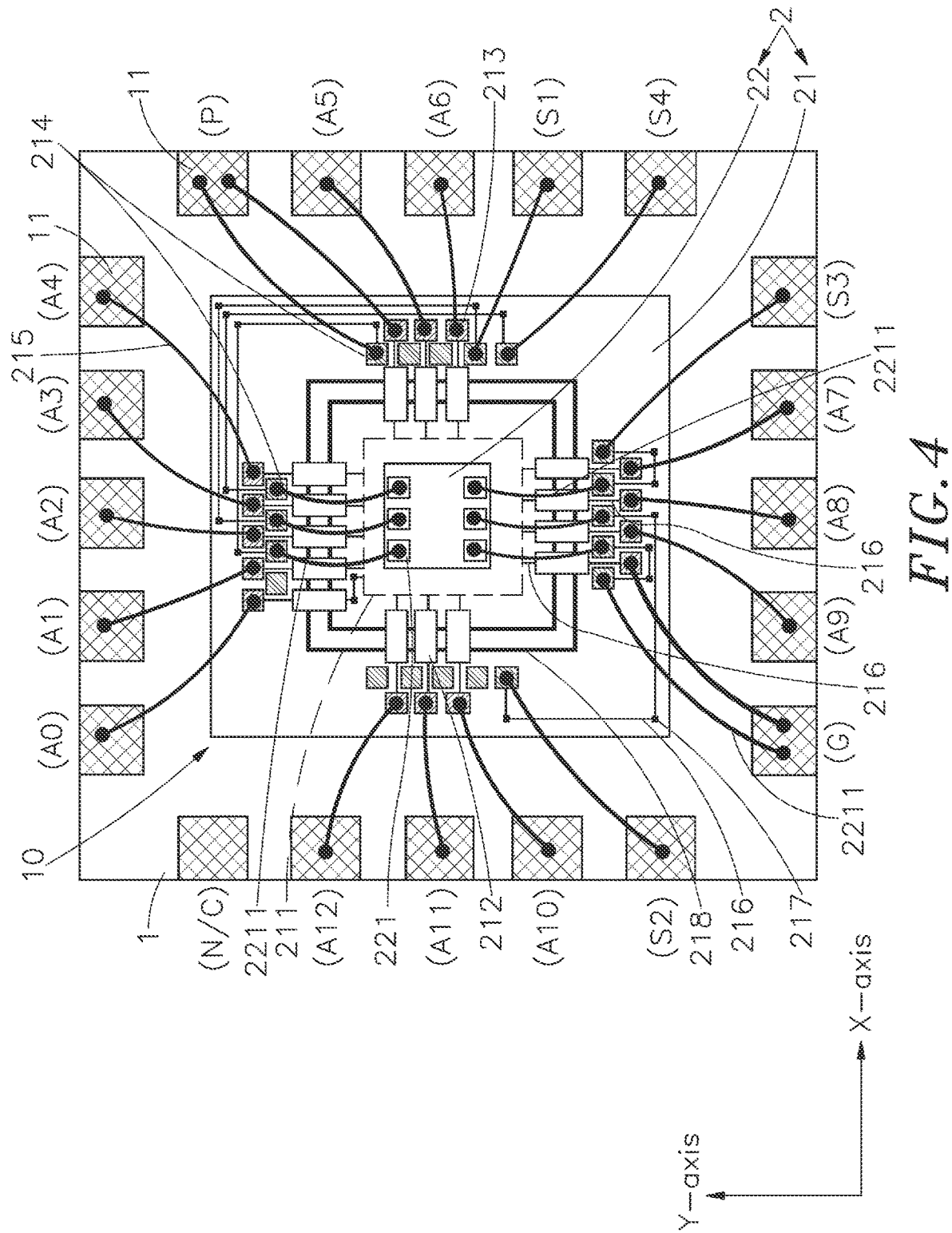
FIG. 4 is a top view of another multichip made in accordance with the present invention.
Figure 5:
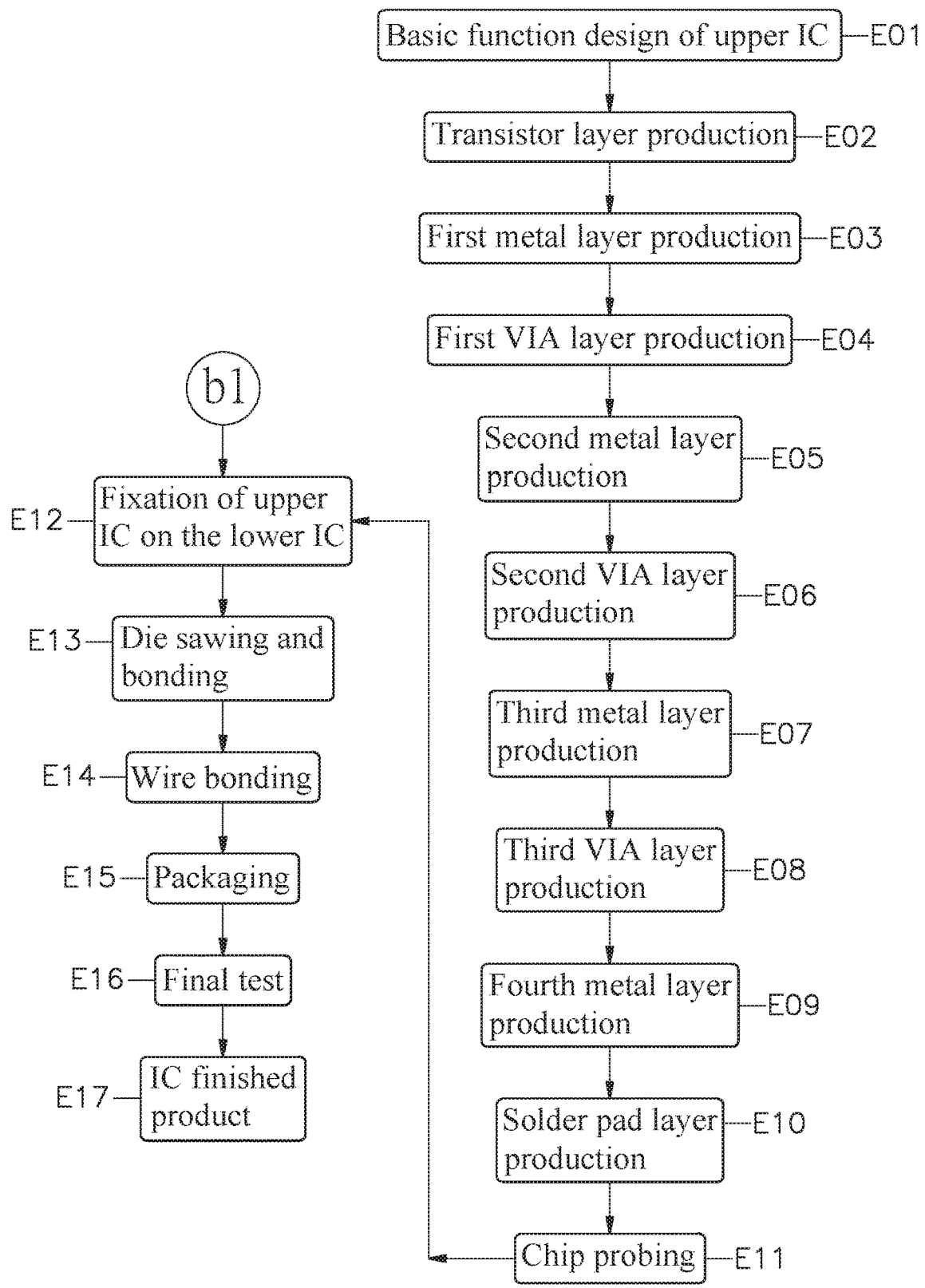
FIG. 5 is an automotive IC production flow chart according to the prior art (I).
Figure 6:
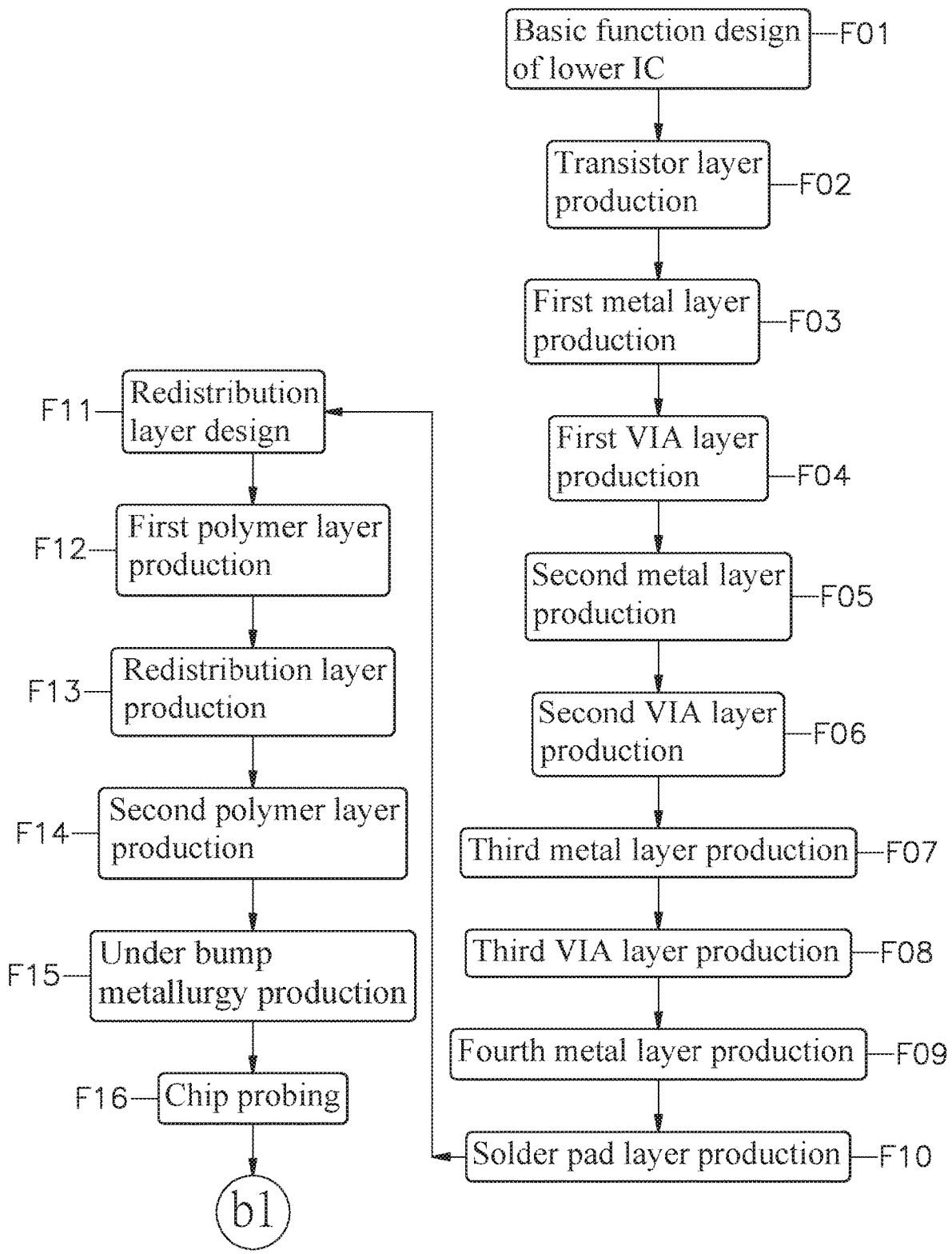
FIG. 6 is an automotive IC production flow chart according to the prior art (II).

Referring to FIGS. 1-4, a multichip production flow chart of the present invention (I), a multichip production flow chart of the present invention (II), a top view of a multichip made in accordance with the present invention and a top view of another multichip made in accordance with the present invention are shown. It can be clearly seen from the drawings that in the preferred embodiment of the stacked multichip of the present invention, the multichip structure is a quad flat no-lead (QFN) package type, and the actual implementation is not limited to this.

The multichip comprises a package carrier board 1 and at least two or more ICs 2. The package carrier board 1 comprises a die-bonding area 10 located in the center, and its four sides are respectively provided with a plurality of external pins 11 for power connection to an external preset electronic circuit. The at least two or more ICs 2 include a first IC 21 and a second IC 22. The first IC 21 is provided with core circuits 211, and the first IC 21 is fixed at the die-bonding area 10 of the package carrier board 1. The first IC 21 comprises a transistor layer with the core circuits 211, a plurality of metal layers, a plurality of VIA layers respectively located between each two adjacent metal layers and a first solder pad layer with a plurality of first solder pads 213 and a plurality of dummy pads 214. Each metal layer is provided with lines 216 in the X-axis or Y-axis. Each VIA layer is located between upper and lower two adjacent metal layers. Each VIA layer has vias 217 for connecting the lines 216 of the upper and lower two adjacent metal layers. At least one side of the core circuits 211 of the first IC 21 can be sequentially provided with a plurality of input and output units 212 and the plurality of first solder pads 213, and the plurality of dummy pads 214 are provided between at least one side of the core circuits 211 the input and output units 212. The core circuits 211 of the first IC 21 can be respectively electrically connected to the transistor layer, each input and output unit 212, each first solder pad 213 and each dummy pad 214 of the first solder pad layer by the lines 216 of each metal layer. Then, bond the second IC 22 to the transistor layer of the core circuits of the first IC 21, and then perform the subsequent process steps of die sawing and bonding, wire bonding, packaging and testing to form it into a multichip for vehicles.

In the first solder pad layer at the top of the first IC 21, the plurality of input and output units 212 and the plurality of first solder pads 213 can be set on at least one side of the core circuits 211, and then the plurality of dummy pads 214 can be set between the input and output units 212 and the first solder pads 213. The core circuits 211 of the first IC 21 can be respectively electrically connected to the transistor layer, each input and output unit 212, each first solder pad 213 and each dummy pad 214 of the first solder pad layer by the lines 216 of each metal layer. Then, bond the second IC 22 to the transistor layer of the second IC 22, and then perform the subsequent process steps of die sawing and bonding, wire bonding, packaging and testing.

The core circuits 211 of the first IC 21 can be produced according to the following steps:
(C01) transistor layer production.
(C02) first metal layer production.
(C03) first VIA layer production.
(C04) second metal layer production.

(C05) second VIA layer production.
(C06) third metal layer production.
(C07) third VIA layer production.
(C08) fourth metal layer production.
(C09) fourth VIA layer production.
(C10) fifth metal layer production.
(C11) production of a plurality of input and output units 212, the plurality of first solder pads 213 and the plurality of dummy pads 214 of the first solder pad layer, wherein steps C08~C11 are performed by modifying the at least one metal layer, the at least one VIA layer and the plural dummy pads 214 for the configuration of the plural second solder pads 221 of the second IC 22; and finally perform:
(C12) Chip Probing (CP).

The steps of (C01)~(C08) of the production of the first IC 21 are designed for the basic functions of the first IC 21. In the steps (C08)~(C11) of the manufacturing process, when there are different design configurations for the multiple second solder pads 221 of different second IC 22, modification can be made on at least one metal layer, at least one VIA layer and the multiple dummy pads 214 of the first solder pad layer without having to modify any level of the steps (C01)~(C07).

The second IC 22 is bonded to the transistor layer of the core circuits 211 of the first IC 21. The second IC 22 comprises the transistor layer, the plurality of meta layers, the plurality of VIA layers respectively located between each two adjacent metal layers and the second solder pad layer with the plurality of second solder pad 221. The production of the second IC 22 comprises the steps of:
(D01) transistor layer production.
(D02) first metal layer production.
(D03) first VIA layer production.
(D04) second metal layer production.
(D05) second VIA layer production.
(D06) third metal layer production.
(D07) third VIA layer production.
(D08) fourth metal layer production.
(D09) production of multiple second solder pads 221 of second solder pad layer.
(D10) chip probing.
(D11) bonding the second IC 22 to the transistor layer of the core circuits 211 of the first IC 21, and then performing the following steps:
(D111) die sawing and bonding.
(D112) wire bonding.
(D113) packaging.
(D114) final test (FT).
(D115) formation of automotive IC package.

The steps of (D01)~(D10) of the production of the second IC 22 are designed for the basic functions of the second IC 22.

The plural first solder pads 213 and the dummy pads 214 provided on at least one side of the core circuits 211 of the first solder pad layer of the first IC 21 can be in mutual alignment or mutual displacement, and they are respectively arranged on both sides of the input and output units 212, and then the plural first solder pads 213 are electrically connected to the corresponding external pins 11 on the package carrier board 1 using first bonding wires 215. As stated above, the first IC 21 comprises a transistor layer with the core circuits 211, the plurality of metal layers, the plurality of VIA layers and the first solder pad layer. The first solder pad layer is provided with the plurality of dummy pads 214. Each metal layer is provided with lines in the X-axis or Y-axis. Each VIA layer is located between upper and lower two adjacent metal layers. Each VIA layer has vias 217, which can be used to connect the lines 216 of the upper and lower two adjacent metal layers, so that the lines 216 of the upper and lower two adjacent metal layers can be electrically conducted through the vias 217 of the respective VIA layer. In the first solder pad layer of the first IC 21, dummy pads 214 are arranged between the core circuits 211 and two adjacent input and output units 212 in different arrangement directions. In the first IC 21, internal lines 216 can be provided between the top two or three metal layers, so that the adjacent dummy pads 214 in the same arrangement direction or two different arrangement directions can be electrically connected by the lines 216. And the VIA layer located between the top two metal layers can have plural vias 217, which can be used to connect the lines 216 between the top two adjacent metal layers. In other words, each dummy pad 214 is electrically connected to another dummy pad 214 through the internal lines 216 formed by the uppermost two or three metal layers and the VIA layer of the first IC 21. This another dummy pad 214 is placed in a suitable location to connect to the external pin 11 by a second bonding wire 2211. With the two dummy pads 214 electrically connected through the internal lines 216, the second bonding wire 2211 will not approach or touch the first bonding wire 215. When the design of each second solder pad 221 of the second solder pad layer of the second IC 22 is changed, it is only necessary to modify the design of the plural dummy pads 214 of the first IC 21 located at the top at least one metal layer, VIA layer, and first solder pad layer. you can increase or decrease the number of dummy pads 214, which can be used for matching between first IC 21 and second IC 22 so that the manufacturing processes of wire bonding and packaging can be performed without needing to change the design of the lines 216 and vias 217 at the layers under the fourth metal layer of the first IC 21, thereby achieving the purpose of saving time, labor and cost in design and production.

The plural first solder pads 213 and the plural dummy pads 214 are respectively arranged on the two sides of the input and output units 212 of the first solder pad layer of the first IC 21 (or the plural first solder pads 213 and the plural dummy pads 214 are arranged adjacently on one side of the input and output unit 212). The corresponding first solder pads 213 and the respective dummy pads 214 can be arranged in mutual alignment, mutual misalignment arrangement, linear arrangement, diagonal arrangement, arc arrangement, front and rear staggered or multiple rows staggered arrangement, etc. It only needs to keep each first solder pad 213, each dummy pad 214, each second solder pad 221 and each external pin 11 from touching the adjacent first bonding wire 215 or second bonding wire 2211. This does not limit the scope of the patent of the present invention. All other modifications and equivalent structural changes, etc., should be included in the scope of the patent of the present invention for the same reason.

The first IC 21 is provided with at least one seal ring 218 between the core circuits 211 and the plurality of first solder pads 213, and the plurality of input and output units 212 can be located on the seal ring 218. At least one side of the core circuits 211 uses the lines 216 to electrically connect plural input and output units 212 and plural first solder pads 213 in sequence.

The plural input and output units 212 are used for the function of signal transmission (input or output) that is a conventional technology. It is mostly designed as impedance matching or electrostatic protection (ESD), etc., as an additional circuit, not a necessary circuit. Adding the plural input and output units 212 will affect the circuit configuration of the overall touch integrated circuit. In addition, the detailed functions of the plural input and output units 212 of the first IC 21 are not the main points of the present invention, so they will not be repeated.

The second IC 22 can be a memory IC such as volatile memory, non-volatile memory or flash memory, application processor IC such as central processing unit (CPU), graphics processor, digital signal processor, cryptographic processors, microprocessors or microcontrollers.

During assembly processing, the first IC 21 and second IC 22 of the at least two or more than two ICs 2 are attached to die-bonding area 10 of the package carrier board 1 in a stack and electrically fixed, and the at least one second solder pad 221 on the surface of the second IC 22 can be electrically connected to the corresponding dummy pad 214 and the corresponding external pin 11 of the package carrier board 1 using the same second bonding wire 2211. Alternatively, the at least one second solder pad 221 on the surface of the second IC 22 may be electrically connected to the corresponding dummy pad 214 by the second bonding wire 2211, and then another second bonding wire 2211 may be used to electrically connect the corresponding dummy pad 214 to the corresponding external pin 11 of package carrier board 1 to complete the wire bonding operation between the package carrier board 1 and the first IC 21 and second IC 22 of the at least two or more than two ICs 2. Thereafter, through the quad flat no-lead (QFN) packaging processing operation, the package carrier board 1, the first IC 21, and second IC 22 can be formed into an automotive multichip package.

In the automotive multichip manufacturing process, the first IC 21 and the second IC 22 are usually manufactured by different manufacturers, and the first IC 21 must be designed to match the pin positions of the plural second solder pads 221 of the second IC 22.

When the design needs to replace the second IC 22 of a different manufacturer, the first IC 21 only needs to modify the design pattern of the metal layer or the mask design of the VIA layer at the top of the engineering change order (ECO), and the original IC process can be used to complete the changes in the same process, without the need to use redistribution layer (RDL). In this way, the layout configuration of the corresponding dummy pads 214 and the lines 216 can be changed to match the pin design of the plural second solder pads 221 of the different second IC 22 without the need to change the original design mode, layout and configuration of the design patterns, etc. of the other metal layers and VIA layers under the fourth metal layer of the first IC 21. It can solve the problem of wire bonding between the at least one set of second solder pads 221 on the surface of the second IC 22 and the dummy pads 214 of the first IC 21 due to pin changes when using the second IC 22 manufactured by a different manufacturer. It saves the complicated procedures of redesigning the circuit layout of the first IC 21, and effectively saves process time, reduces design and manufacturing costs, and is more economical.

Therefore, the present invention is mainly designed for automotive multichip. When the second IC 22 of the automotive multichip is replaced by a different manufacturer and the pin positions of the second solder pads 221 are changed, the at least one metal layer, VIA layer and dummy pads 214 of the first solder pad layer on the top of first IC 21 can be modified to let the first IC 21 match the new the second IC 22 without the need of changing the design of the multiple metal layers, multiple VIA layers and the solder pads of the entire first IC 21. However, the above is only the preferred embodiments of the present invention, and it does not limit the patent scope of the present invention. Therefore, all simple modifications and equivalent structural changes using the description and schematic content of the present invention should be included in the scope of the patent of the present invention. Accordingly, the invention is not to be limited except as by the appended claims.

What the invention claimed is:

1. A multichip package manufacturing process for making a multichip package comprising a package carrier board and a plurality of ICs, said package carrier board comprising a die-bonding area and a plurality of external pins provided at at least one side of said die-bonding area, said die-bonding area being provided for the bonding of said ICs in a stack, said ICs including a first IC chip and a second IC chip, said first IC chip comprising a transistor layer with core circuits, a plurality of metal layers, a plurality of VIA layers and a first solder pad layer with a plurality of first solder pads and a plurality of dummy pads, said second IC chip comprising a transistor layer, a plurality of metal layers, a plurality of VIA layers and a second solder pad layer with a plurality of second solder pads, the multichip package manufacturing process comprising the steps of first IC chip production, first IC chip probing, second IC production, second IC chip probing, die sawing and bonding, wire bonding, packaging and final test to form an automotive IC package, wherein producing said first IC chip comprises the steps of:
   (C01) producing the transistor layer of the first IC chip;
   (C02) producing a first metal layer of the first IC chip;
   (C03) producing a first VIA layer of the first IC chip;
   (C04) producing a second metal layer of the first IC chip;
   (C05) producing a second VIA layer of the first IC chip;
   (C06) producing a third metal layer of the first IC chip;
   (C07) producing a third VIA layer of the first IC chip;
   (C08) producing a fourth metal layer of the first IC chip;
   (C09) producing a fourth VIA layer of the first IC chip;
   (C10) producing a fifth metal layer of the first IC chip;
   (C11) producing the plural first solder pads and the plural dummy pads of the first solder pad layer;
   wherein steps C08-C11 are performed by modifying at least one said metal layer, at least one said VIA layers and the plural said dummy pads for the configuration of said second pads of said second IC.

2. The multichip package manufacturing process as claimed in claim 1, wherein the steps C01-C08 of the production of said first IC chip are designed for basic functions of said first IC chip.

3. The multichip package manufacturing process as claimed in claim 1, wherein said VIA layers of said first IC chip are respectively located between each two adjacent said metal layers of said first IC chip; each said metal layer of said first IC chip is provided with a plurality of lines in an X-axis or Y-axis; said first solder pad layer of said first IC chip comprises a plurality of input and output units and the plurality of first solder pads located at at least one side of said core circuits and electrically connected to said lines, and the plurality of dummy pads located between at least one side of said core circuits and said input and output units.

4. The multichip package manufacturing process as claimed in claim 3, wherein said core circuits of said first IC chip are respectively electrically connected to said transistor layer, each said dummy pad, each said input and output unit and each first solder pad of said first solder pad layer by said lines; each said VIA layer comprises a plurality of vias electrically connected between the lines between the two adjacent said metal layers.

5. The multichip package manufacturing process as claimed in claim 1, wherein said VIA layers of said first IC chip are respectively located between each two adjacent said metal layers of said first IC chip; each said metal layer of said first IC chip is provided with a plurality of lines in an X-axis or Y-axis; said first solder pad layer of said first IC chip comprises a plurality of input and output units and the plurality of first solder pads respectively located at at least one side of said core circuits and respectively electrically connected to said lines, and the plurality of dummy pads located between said input and output units and said first solder pads.

6. The multichip package manufacturing process as claimed in claim 5, wherein said core circuits of said first IC chip are respectively electrically connected to said transistor layer, each said input and output unit, each said dummy pad and each said first solder pad of said first solder pad layer by said lines; each said VIA layer comprises the plurality of vias electrically connected between the lines between the two adjacent said metal layers.

7. The multichip package manufacturing process as claimed in claim 1, wherein said VIA layers of said second IC chip are respectively located between each two adjacent said metal layers of said second IC chip; the production of said second IC chip comprises the steps of:

(D01) producing the transistor layer of the second IC chip;
(D02) producing a first metal layer of the second IC chip;
(D03) producing a first VIA layer of the second IC chip;
(D04) producing a second metal layer of the second IC chip;
(D05) producing a second VIA layer of the second IC chip;
(D06) producing a third metal layer of the second IC chip;
(D07) producing a third VIA layer of the second IC chip;
(D08) producing a fourth metal layer of the second IC chip; and
(D09) producing the plural second solder pads of the second solder pad layer.

\* \* \* \* \*